(12) United States Patent
Sanduleanu et al.

(10) Patent No.: US 7,251,573 B2
(45) Date of Patent: Jul. 31, 2007

(54) PHASE DETECTOR

(75) Inventors: Mihai Adrian Tiberiu Sanduleanu, Eindhoven (NL); Eduard Ferdinand Stikvoort, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/569,125

(22) PCT Filed: Aug. 11, 2004

(86) PCT No.: PCT/IB2004/051448

§ 371 (c)(1), (2), (4) Date: Feb. 23, 2006

(87) PCT Pub. No.: WO2005/022819

PCT Pub. Date: Mar. 10, 2005

(65) Prior Publication Data

US 2007/0021933 A1 Jan. 25, 2007

(30) Foreign Application Priority Data

Aug. 29, 2003 (EP) .................................. 03103249

(51) Int. Cl.
*G06F 19/00* (2006.01)

(52) U.S. Cl. .................. 702/79; 702/182; 702/189; 331/2; 331/25; 329/304; 329/311; 375/226; 375/260; 375/373

(58) Field of Classification Search .................. 702/72, 702/79, 182, 189; 331/2, 25; 329/304, 311; 375/226, 260, 373, 375

See application file for complete search history.

(56) References Cited

U.S. PATENT DOCUMENTS

| | | | | |
|---|---|---|---|---|
| 5,805,108 A | * | 9/1998 | Lennen | 342/357.12 |
| 5,831,461 A | * | 11/1998 | Dawe | 327/147 |
| 6,016,080 A | * | 1/2000 | Zuta et al. | 331/25 |
| 6,028,898 A | * | 2/2000 | Sparks et al. | 375/317 |
| 6,151,356 A | * | 11/2000 | Spagnoletti et al. | 375/226 |

OTHER PUBLICATIONS

Renaud et al., 'A CMOS Three-State Frequency Detector Complementary to An Enhanced Linear Phase Detector for PLL, DLL or High Frequency Clock Skew Measurement', 2003, IEEE Publication, pp. 148-151.*

Wantanabe et al., 'An All-Digital PLL for Frequency Multiplication by 4 to 1022 with Seven-Cycle Lock Time', Feb. 2003, IEEE Publication, vol. 38, No. 2, pp. 198-204.*

* cited by examiner

Primary Examiner—Hal Wachsman
Assistant Examiner—Elias Desta

(57) ABSTRACT

The present invention concerns a phase Detector for detecting a phase difference between a data clock DATA-CLK and a reference clock REF-CLK using a data signal DATA. A trasnition of the data signal DATA is synchronous with a transition of the data clock DATA-CLK. The data clock DATA-CLK and the reference clock REF-CLK have the same frequency. The phase detector includes first signal generator for generating a first binary signal ERRQ a second signal generator for generating a second binary signal ERRI. The pulse width of the second binary signal ERRI is equal to a second time difference $\Delta T2$ between a transition of the data signal DATA and a transition of the second reference clock signal CKI adjacent to the transition of the data signal DATA.

8 Claims, 17 Drawing Sheets

| A | B | /A | /B | Q | /Q |
|---|---|----|----|---|----|
| 0 | 0 | 1  | 1  | $V_{DD}-2I_0R$ | $V_{DD}-I_0R$ |
| 0 | 1 | 1  | 0  | $V_{DD}-I_0R$  | $V_{DD}-2I_0R$ |
| 1 | 0 | 0  | 1  | $V_{DD}-I_0R$  | $V_{DD}-2I_0R$ |
| 1 | 1 | 0  | 0  | $V_{DD}-2I_0R$ | $V_{DD}-I_0R$ |

| A | B | /A | /B | Q | /Q |
|---|---|---|---|---|---|
| 0 | 0 | 1 | 1 | $V_{DD}-2I_0R$ | $V_{DD}-I_0R$ |
| 0 | 1 | 1 | 0 | $V_{DD}-I_0R$ | $V_{DD}-2I_0R$ |
| 1 | 0 | 0 | 1 | $V_{DD}-I_0R$ | $V_{DD}-2I_0R$ |
| 1 | 1 | 0 | 0 | $V_{DD}-I_0R$ | $V_{DD}-2I_0R$ |

PHASE DETECTOR

Clock and data recovery (CDR) is a critical function in high-speed transceivers. Such transceivers serve in many applications including optical communications. The data received in these systems are both asynchronous and noisy requiring, that a clock be abstracted to allow synchronized operations. Furthermore, the data must be "retimed" such that the jitter accumulated during transmission is removed.

In order to perform synchronous operations such as retiming and demultiplexing on random data the high-speed transceivers must generate a clock. As illustrated in FIG. 1, a clock recovery circuit senses the data and produces a periodic clock. A D-flipflop (DFF) driven by the clock then retimes the data, i.e. it samples the noisy data. This yieds an output with less jitter.

The clock generated in the circuit of FIG. 1 must satisfy three important conditions:

It must have a frequency equal to the data rate. For example, a data rate of 10 Gb/s translates to a clock frequency of 10 GH (with a period of 100 ps), The clock must bear a predefined phase relationship with respect to the data, allowing optimum sampling of the bits by the clock. If the rising edges of the clock coincide with the midpoint of each bit, the sampling occurs farthest from the preceeding and following data transitions. A maximum margin for jitter and other timing uncertainties may be provided thus, The clock must exhibit a small jitter since it is the principal contributor to the retimed data jitter.

FIG. 2 shows a conventional clock recovery circuit. The clock recovery circuit comprises a voltage controlled oscillator VCO, which is responsible for outputting the clock signal, as shown in FIG. 1. The transitions of the clock signal output by the voltage controlled oscillator VCO have to be synchronised with the transitions of the input random data (NRZ data). The circuit shown in FIG. 2 has two parallel feedback loops. The first one called frequency loop adjusts the frequency of the voltage controlled oscillator VCO to the frequency of the estimated clock of the input data. The frequency loop comprises a frequency detector, a charge pump and a low pass filter (LPF). The second feedback loop of FIG. 2 is a phase loop. The phase loop comprises a phase detector, a charge pump and a low pass filter LPF. The phase detector compares the phase of the data transitions (NRZ data transitions) with the phase of the recovered clock. For a linear phase detector the pulse width must be proportional to the detected phase difference. The pulses output by the phase detector are integrated by the low pass filter LPF and the voltage of this filter drives the fine tuning input of the voltage controlled oscillator VCO. The output of the low pass filter in the phase loop has an amplitude proportional to the phase difference detected by the phase detector. The charge pump circuits are needed to ensure a linear charging/discharging of the low pass filters LPF inside the frequency and phase loops.

At very high speeds the oscillator design is difficult. For this reason clock and data recovery circuits (CDR-circuits) are made with the input random data (NRZ-data) at full rate but use a voltage control oscillator VCO running at half the input data rate. This technique also relaxes the speed requirements of the phase detector and in some RDR-configurations of the frequency dividers. These data recovery circuits are called half-rate architectures. They require a phase detector that provides a valid output while sensing a full-rate random data stream and a half-rate clock. In other words, if the data rate equals 10 Gb/s, then the recovered clock frequency is equal to 5 GH (half the data clock).

FIG. 3a shows a conventional half-rate phase detector. The circuit comprises two D-flip-flops L1 and L2 as well as an XOR-gate. The D-inputs of both D-flip-flops L1 and L2 receive the data signal DIN (corresponding to NRZ-data in FIG. 2). The C-input of the D-flip-flop L1 is driven by the clock CK (CK corresponds to the recovered clock in FIG. 2). The C-input of the D-Flip-Flop L2 is driven by the inverted clock CK. Thus a data transition $D_{IN}$ is only transmitted to the output A of the D-flip-flop L1 during the high phase of the clock CK. Correspondingly, the data transition in $D_{IN}$ is only transferred to the output B of D-flip-flop L2 during a low phase of clock CK. During a low phase of the clock CK the output A of L1 remains unchanged. Correspondingly, the output B of D-flip-flop L2 remains unchanged during a high phase of the clock CK. Signals A and B are input to an EXOR-gate. $D_{out1}$ is the output the XOR-gate as well as the output of the phase detector shown in FIG. 3a. The right hand side of FIG. 3a shows an example for the signals of the phase detector. The width of the signals output by $D_{out1}$ corresponds to the time difference between a transition in $D_{in}$ and the next rising or falling edge of the clock CK. The frequency of the clock CK is half the frequency of the data clock. A clock with twice the frequency of CK has a rising edge at both the rising and falling edges of CK. Therefore, a transition between $C_{in}$ and a rising edge in the double frequency clock may be detected by determining the distance in time between a transition in $D_{in}$ and the next transition (rising or falling edge) of the clock CK.

If a transition in $D_{in}$ occurs during the high phase of the clock CK, then the output of L1 (A) outputs this transition immediately. The latch L2 waits until CK is low and then outputs the transition $D_{in}$ (see FIG. 6). The difference between a DATA transition in $D_{in}$ and the falling clock of CK is equal to the time, that A and B differ. $B_{out1}$ is equal to one, whenever A and B differ. The length of a signal $D_{out1}$ is equal to the phase difference to be detected.

FIG. 3b shows a half rate linear phase detector which has been presented by J. Savoy and a B. Razari in "high speed CMOS circuits for optical receivers", Kluwer Academic Publishers, 2001, ISBN 0-7923-7388-X. This circuit is an extension of the Hogge's detector at half rate. The data $D_{in}$ are sampled at half rate with the D-flip-flops L1 and L2 on both edges of the clock CK. The error between the clock and the data is being measured by the first XOR-gate at the outputs A and B of L1 and L2. Since $D_{out1}$ is equal to A XOR B, the width of the $V_{out1}$ signals is equal to the phase difference to be detected. The second pair of D-flip-flops L3 and L4 outputs the retimed data at half rate. One can obtain the full speed data clock after multiplexing the outputs of L3 and L4. The second XOR-gate generates the signal $V_{out2}$ which constitutes a constant pulse, whenever the data signal has a transition. Its output $V_{out3}$ can be subtracted from the $V_{out1}$ signal to compensate for the situation when data had a transition and the clock CK and data $D_{in}$ are in phase. The timing diagrams are depicted next to the circuit shown in FIG. 3b.

The advantage of this architecture consists in its simplicity and in the lesser stringent requirements for the set up and hold times of the sampling latches. Since the two latches L1 and L2 work in an interleaved way, the positive feedback circuit in the latch (D-flip-flop) has more time for a decision. Another advantage is the possibility to have the retimed data at full rate. This is an important fact for the situation, when a direct conversion receiver (DCR) works as a pure regenerator (repeater) needed to clean up the jittering data. In DCR applications the difficulty comes from the necessity to generate an error signal, whenever data has a transition and keep the same output when no transition is presented. Since the input data is random, it can have long patterns without transitions, pushing or pulling the voltage control oscillator (VCO) at a different frequency and the complete direct conversion receiver (DCR) out of lock. That is why the phase detector, which is in insensitive to a data transition density constitutes a phase detector keeping the same value at the output when no transitions occur. At the same time the data is present at half rate at the output A and B. In a demultiplexed situation the two outputs A and B can be demultiplexed at lower data rates.

The disadvantage of this circuit is obviously the need to wait until the reference signal $D_{out2}$ has settled, in order to generate a phase error and a correction signal $D_{out1}$. Besides, in phase lock, this signal $D_{out2}$ is two times wider than the signal $D_{out1}$. That is why the $D_{out1}$ signal has to be multiplied by two in order to get a signal with a zero average.

Ideally a parallel type of operation for the error signal $V_{out1}$ as well as for the reference signal $V_{out2}$ is desired.

It is object of the present invention, to provide a phase detector, which overcomes the previously mentioned drawbacks of the state of the art.

The problem is solved by a phase detector according to the appended claim 1. The phase detector is adapted to detecting a phase difference between a data clock DATA-CLK and a reference clock REF-CLK by using a data signal DATA. A transition of the data signal DATA is synchronous with a transition of the data clock DATA-CLK and the data clock DATA-CLK and the reference clock REF-CLK have the same frequency. The phase detector comprises a first signal generator 42 for generating a first binary signal ERRQ. A pulse width of the first binary signal is equal to a first time difference $\Delta T1$ between a transition of the data signal DATA and a transition of a first reference clock signal CKQ adjacent to the transition of the data signal DATA. The pulse width of the first binary signal may represent both the width of a positive or a negative pulse in the first binary signal. The first signal generator comprises an input for receiving the first reference clock signal CKQ and an input for receiving the data signal DATA. The first reference clock has half the frequency of the reference clock and is synchronous with the reference clock. The phase detector further comprises a second signal generator 40 for generating a second binary signal ERRI. A pulse width of the second binary signal is equal to a second time difference $\Delta T2$ between a transition of the data signal DATA and a transition of the second reference clock signal CKI adjacent to the transition of the data signal DATA. The pulse width of the second binary signal may represent the width of a positive or a negative pulse. The second signal generator 40 comprises an input for receiving the data signal DATA and an input for receiving the second reference signal CKI. In both the first and second binary signal a negative pulse as well as a positive pulse may represent a logical 1. A logical 0 may be represented by both a positive as well as a negative pulse. The phase detector comprises an output signal generator for generating an output signal representative of the phase difference between the data clock DATA-CLK and the reference clock REF-CLK. The output signal is equal to ERRQ−2*(ERRQ AND ERRI). AND represents a logical AND-operation. The output is also equal to ERRQ XOR ERRI−ERRI. XOR represents a logical XOR-operation. Both equations yield the same output signals. The output signals may represent both voltage and current pulses. If the first and second binary signals ERRQ and ERRI assume the values 0 and 1, then the output signal may have the values +1, −1 and 0. In this case, the area under the output signal during a period of the data clock is equal to the phase difference to be detected. An integrator may be used in order to convert the pulse sequence of the phase detector into a signal having an amplitude representative of the phase difference.

Embodiments of the present invention will be described with reference to the accompanied drawings below.

Figure 1:
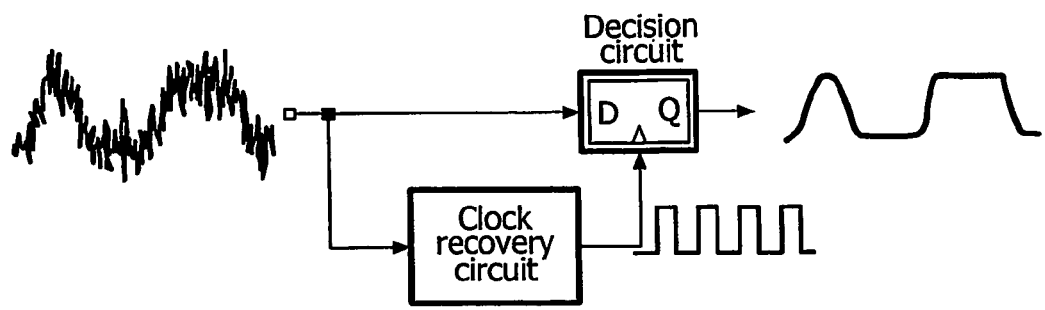
FIG. 1 shows a conventional high speed receiver.
Figure 2:
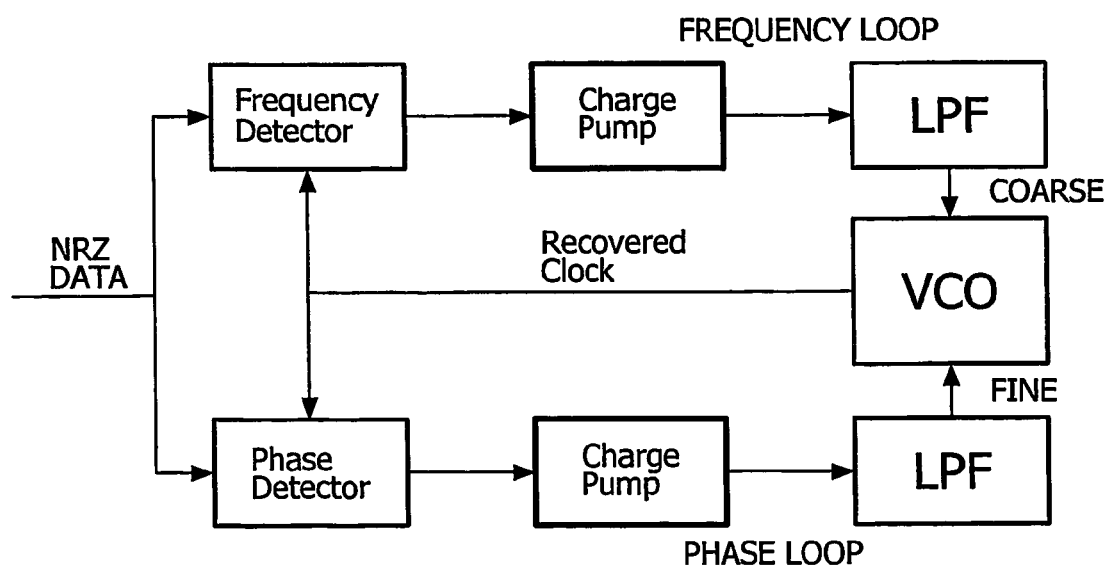
FIG. 2 shows a conventional clock recovery circuit.
Figure 3A:
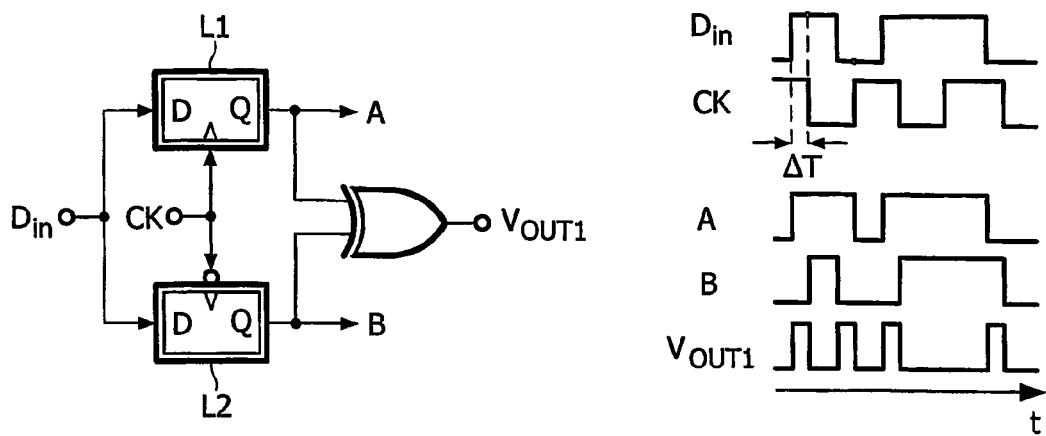
FIG. 3 shows a conventional half rate phase detector on the left side and a timing diagram for the signals of the conventional half rate phase detector on the right side.
Figure 3B:
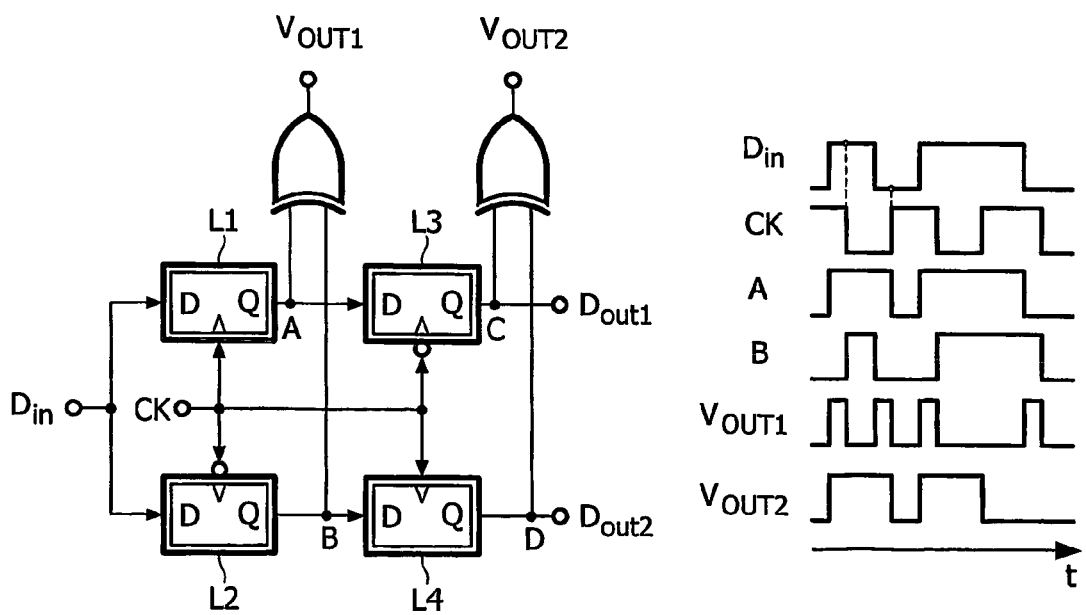
Figure 4:
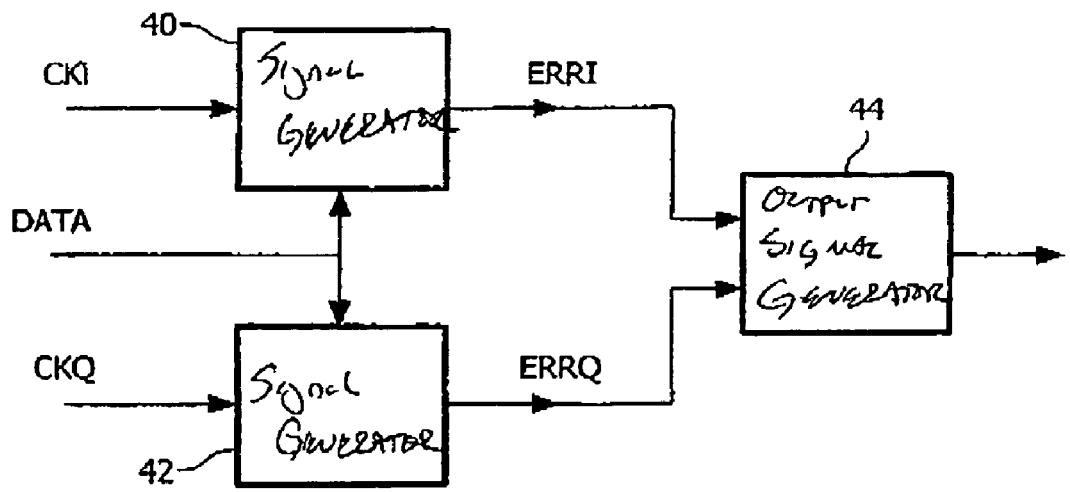
FIG. 4 shows another conventional half rate phase detector on the left side and a timing diagram for the signals of the conventional half rate phase detector on the right side.
Figure 5:
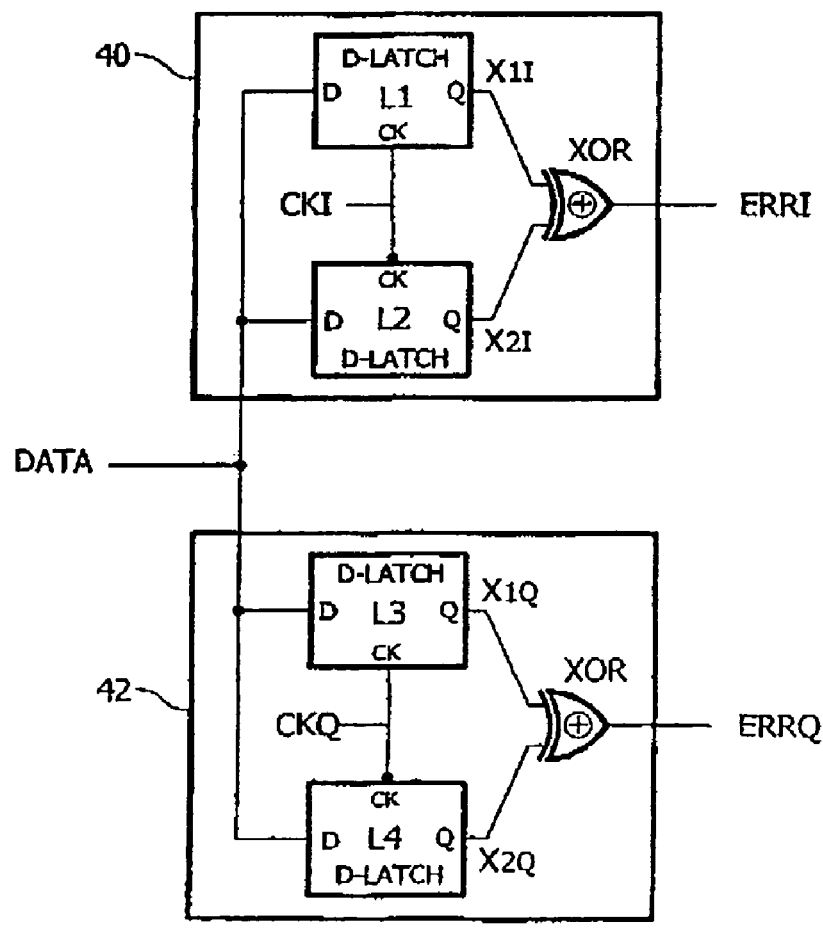
FIG. 5 shows an embodiment of a first signal generator and the second signal generator of the present invention.

The first signal generator 42 shown in FIG. 5 comprises a first D-latch (D-flip-flop) L3 and a second D-latch L4 as well as an XOR-gate. The first and second D-latches L3 and L4 each comprise two inputs D and Ck and an output Q. Both inputs D of the first and second D-latch L3 and L4 are connected to a line for the data signal. The input Ck of the first D-latch L3 is connected to the first reference clock signal CKQ and the input CK of the second latch L4 is connected to the inverted reference clock signal CKQ. The signal output by the first D-latch L3 is called $X_{1Q}$ and the signal output by the second D-latch L4 is called $X_{2Q}$. $X_{1Q}$ and $X_{2Q}$ are connected to the inputs of the exclusive OR-gate, which outputs the first binary signal ERRQ. The D-latch L3 is transparent to the data input during the positive level of the clock CKQ. This means, that a change in the data signal is only output to the XOR-gate during a high phase of the reference clock signal CKQ. Inversely, latch L4 is only transparent to the data signal during a low phase of the clock CKQ. This means, that the first binary signal ERRQ is only high, if the signals $X_{1Q}$ and $X_{2Q}$ differ. $X_{1Q}$ and $X_{2Q}$ differ, if a transition in the data signal takes place, since only one of the two latches is transparent to the signal change. Once the first reference clock signal TKQ makes a transition, the signals $X_{1Q}$ and $X_{2Q}$ have the same value. Consequently, the first binary signal ERRQ will be low. Therefore, the signal output by the XOR-gate have a width, which is equal to the phase difference between the clock CKQ and the data signal.

The second signal generator 40 for generating a second binary signal ERRI shown in FIG. 5 is built in the same way as the first signal generator 42 shown in FIG. 5. Instead of the first reference clock signal CKQ a second reference clock CKI is used. Consequently, the signal ERRI output by the second binary signal generator has a length, which corresponds to the phase shift between a data transition and a transition in the reference clock signal CKI. The second reference clock CKI is phase shifted with regard to the first reference clock signal CKQ by ¼f, wherein f is the frequency of both the first reference clock CKQ and the second reference clock CKL.

Figure 6:
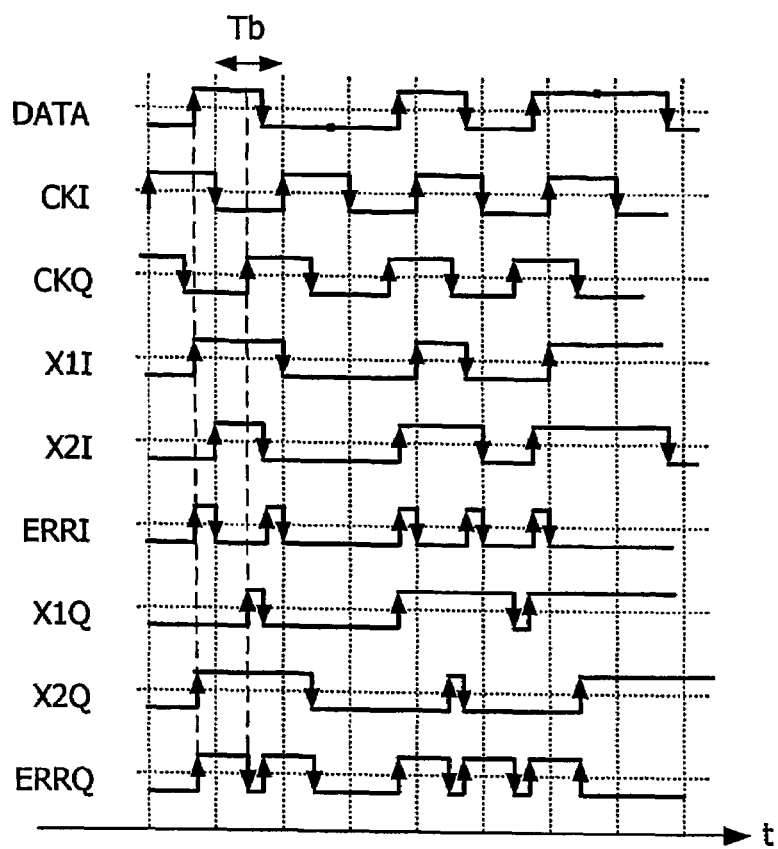
FIG. 6 shows an example for the signals generated in a first and a second signal generator of FIG. 5.
Figure 7:
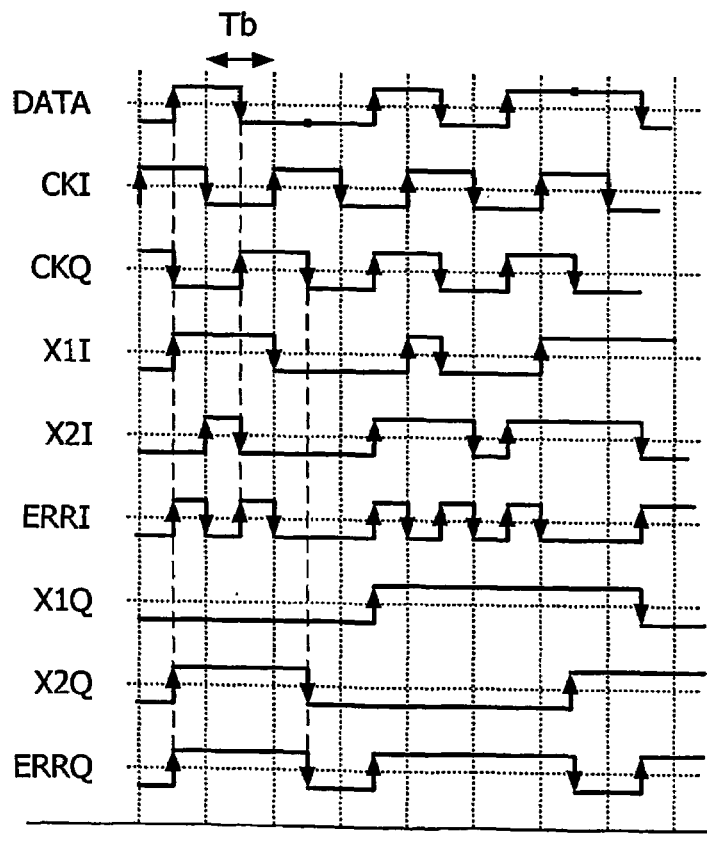
FIG. 7 shows a further example of the signals generated in the first and second signal generators of FIG. 5.

In FIG. 6, the signals data, CKI, CKQ, $X_{1L}$ and $X_{2L}$, RE, $X_{1Q}$, $X_{2Q}$ and ERRQ are shown on top of each other. The signal DATA shown in FIG. 6 is an example of a DATA signal, received by the reference signal generators 40 and 42. The transitions of the DATA signal are synchronous with a rising edge of a DATA clock. The DATA clock has twice the frequency of the reference clocks CKI und CKQ. Tb indicated the period of the DATA clock. The reference clock signals CKI and CKQ are phase shifted with regard to each other by Tb/2. The first rising edge of the DATA signal occurs during a high phase of the clock CKI. Therefore the output $X_{1L}$ of latch L1 is transparent to this DATA signal transition. The DATA signal is output by the second D-latch L2, when the reference clock signal CKI is low (the reference clock signal CKI is high). The width of the first signal pulse of ERRI shown in FIG. 6 is equivalent to the distance in time between the first transition of the DATA signal and the adjacent transition of the reference clock CKI. Correspondingly, the width of the signal ERRQ is equal to the distance in time between the transition of the DATA signal and the next transition of the reference clock CKQ. FIG. 7 shows the same signals as FIG. 6 for the case, in which CKQ is in phase with the DATA transitions. In this case the width of the signal pulses of ERRI is equal to Tb/2 and the width of the signal pulses ERRQ is equal to 2*Tb. This is due to the fact, that CKQ has a down transition, whenever data has an up transition, and CKQ has an up transition, when data has a down transition. The previous remarks are true for the first signal pulses of ERRI and ERRQ. Please note, that connecting signals ERRI and ERRQ via an AND-gate yields the signal ERRI'. The area under the first two pulses of ERRI' is equal to half the area under the first signal pulse of ERRQ. Therefore, ERRQ−2*(ERRI and ERRQ) yields a signal representative of the phase difference zero. The area under this signal is equal to 0.

Figure 8:
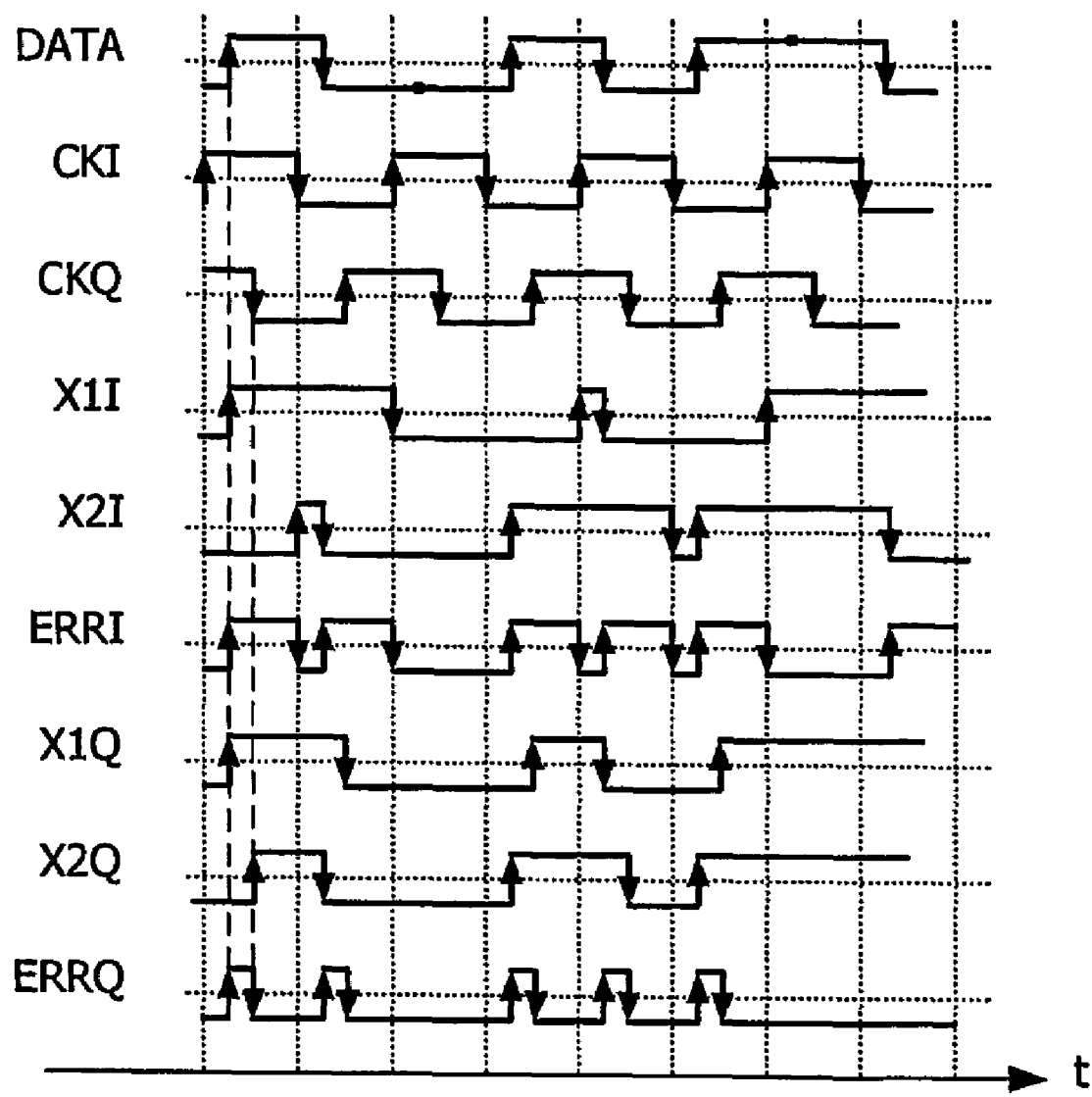
FIG. 8 shows another example of the signals generated in the signal generators shown in FIG. 5.

FIG. 8 shows another example of the signal generated by the circuit shown in FIG. 5. In this case, the first data transition occurs during a high phase of CKQ and during a high phase of CKI. The transition of the CKQ occurs before the down transition of CKL. The phase difference to be detected is equal to the time difference between the up transition of the DATA signal and the down transition of CKQ. Therefore the length of the signal pulses shown for ERRQ is equal to the phase difference to be detected. Connecting ERRI and, ERRQ with and AND-gate yields ERRQ. ERRQ−2(ERRI and ERRQ) yields −ERRQ. The equation also holds for this case.

Figure 9:
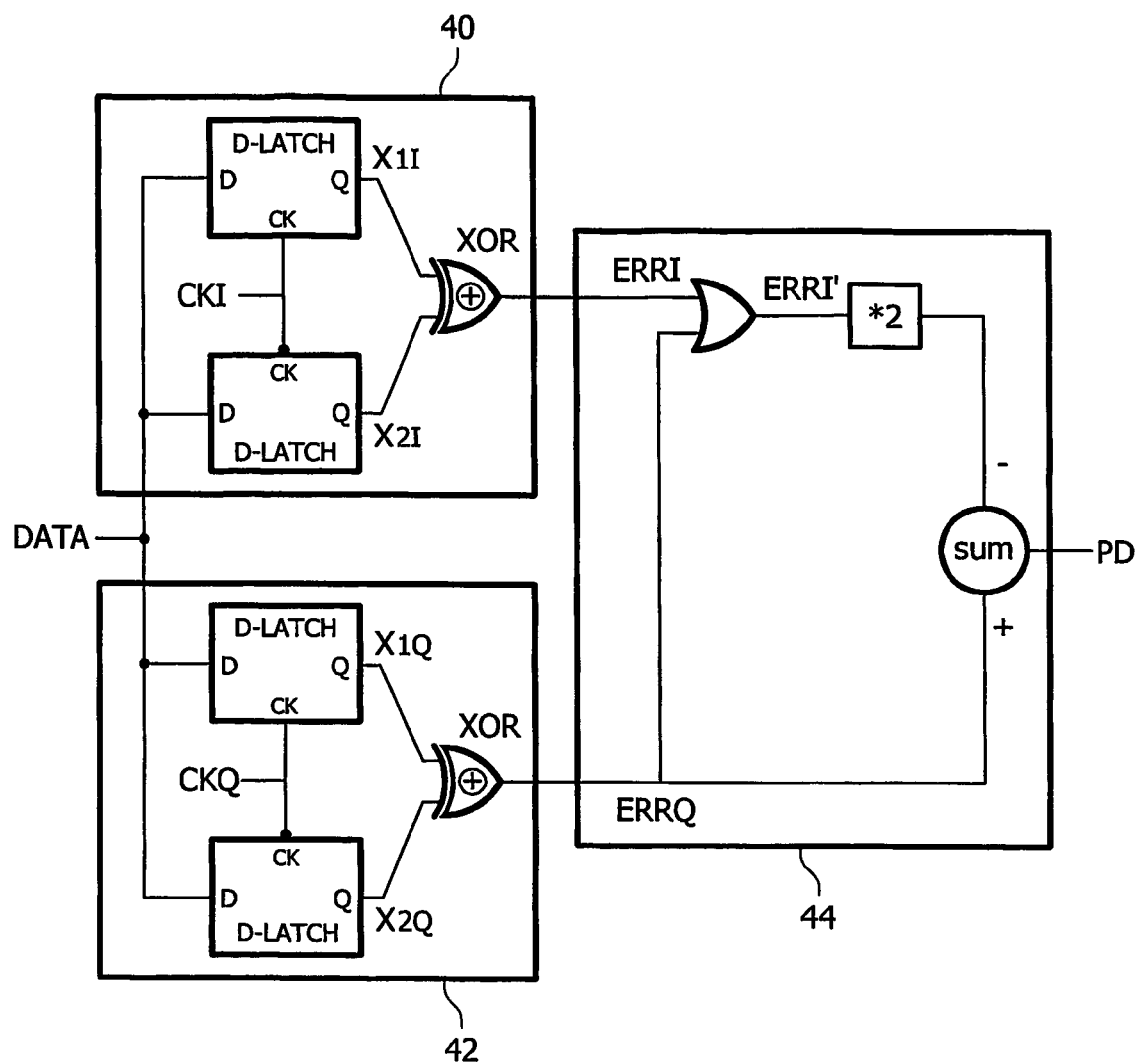
FIG. 9 shows a first embodiment of the present invention.

FIG. 9 shows a first embodiment of the present invention. The phase detector of FIG. 9 comprises the signal generators 40 and 42 shown in FIG. 5. The phase detector further comprises and output signal generator 44, which outputs an output signal Pd representative of the phase difference to be detected. The output signal generator comprises two inputs connected to the outputs of the first signal generator (42) and the second signal generator (40). The output signal generator 44 comprises and AND-gate, which is connected to the signals ERRI and ERRQ from the first and second signal generators. ERRI' constitutes the output signal of the AND-gate. This signal is input in a multiplicator, which multiplies the signal by two. The output of the multiplicator *2 is input to a summing unit SUM. The summing unit SUM subtracts the output of the multiplicator *2 from the first reference signal ERRQ, which is also input to the summing unit. The output signal generator 44 constitutes the logical circuit, which corresponds to equation PD=ERRQ−2(ERRI and ERRQ).

Figure 10:
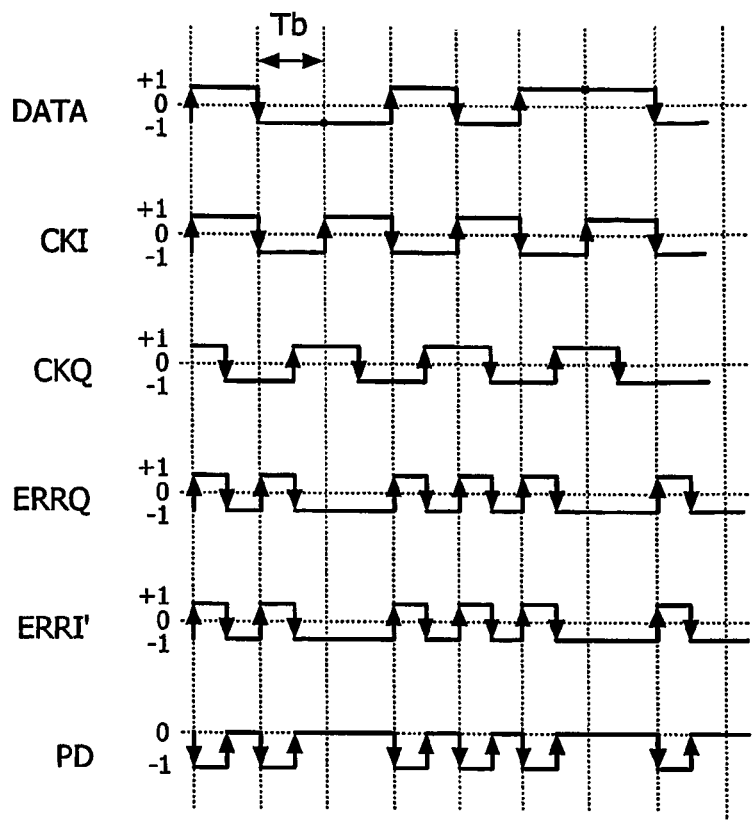
FIG. 10 shows an example of the signals generated in the first embodiment of the present invention.

FIG. 10 shows the different signals DATA, CKI, CKQ, ERRQ, ERRI' and PD for the case, in which CKQ is phase shifted by Tb/2 with regard to the data clock. Tb represents the period of the data clock. As can be seen in FIG. 10, the edges of the clock CKQ lag behind by Tb/2 in comparison with the edges of the data signal. CKI is in phase with the data signal. The phase difference between CKQ and CKI is Tb/2. The resulting phase difference pulses PD are negative. The length of these pulses is equal to Tb/2. Therefore the length of the signal PD represents the phase difference between the reference clock CKQ and the data clock. Signals ERRQ and ERRI' are identical. Consequently the output Pd, which is equal to ERRQ−2*ERRI', corresponds to the signal ERRQ.

Figure 11:
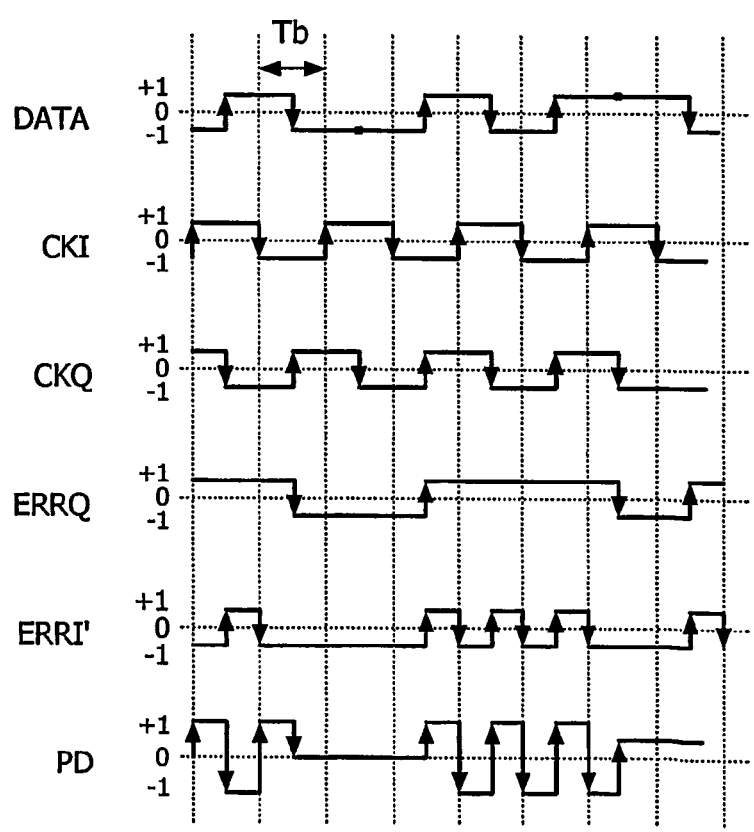
FIG. 11 shows another example of the signals generated in the first embodiment of the present invention.

FIG. 11 shows another example of the signal generated by the circuit shown in FIG. 9. The transitions of the clock CKQ and the transitions of the signal data are synchronous, i.e. the data clock is in phase with the clock CKQ. The output PD alternates between +1 and −1 in such a way, that the average output is 0. The integral over PD for a time period Tb is equal to 0. When data transmissions are missing, the output will be 0. In this case, the transitions of the data signals are synchronous with the transitions of CKQ.

Figure 12:
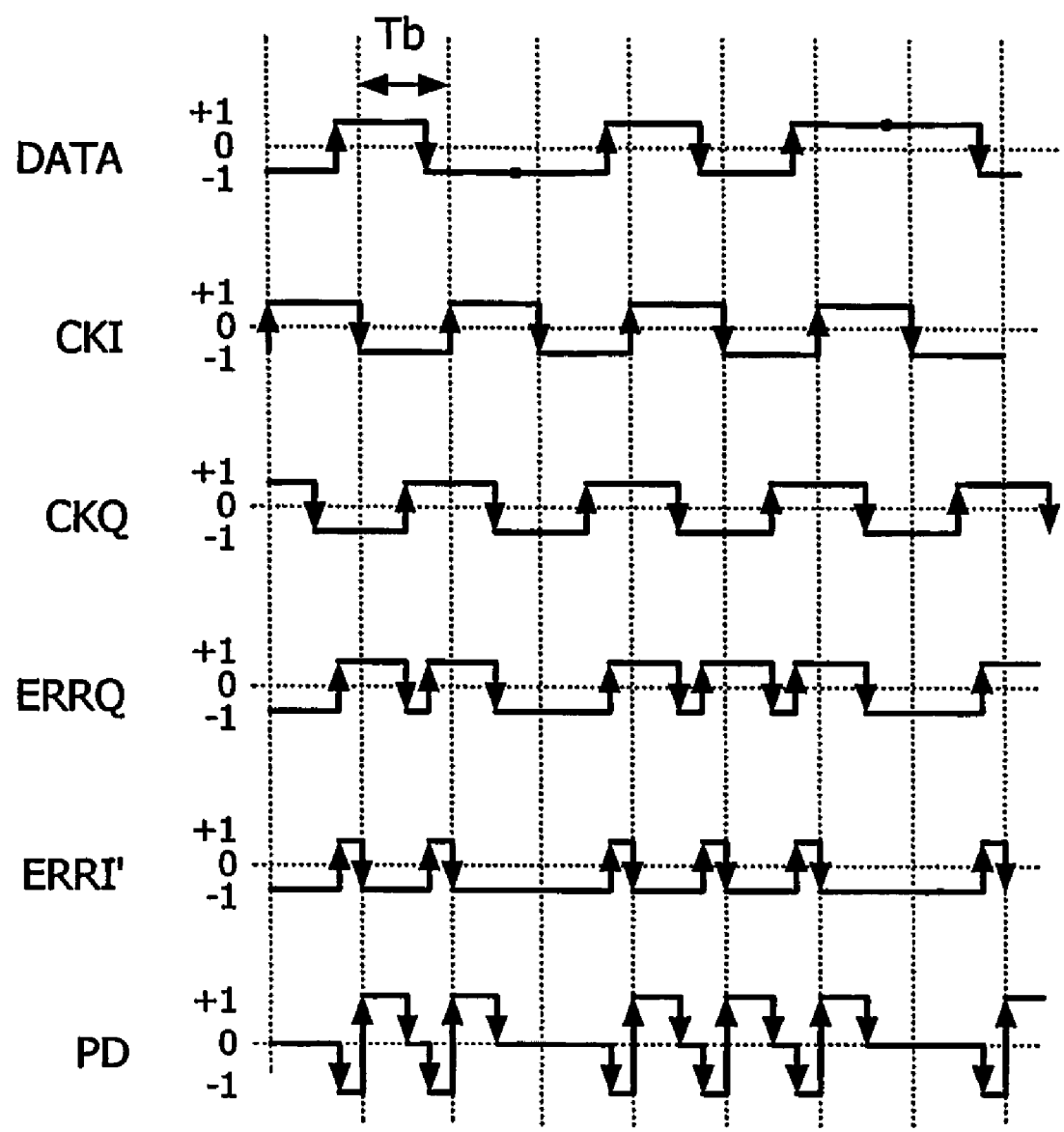
FIG. 12 shows a further example of the signals generated in the first embodiment of the present invention.
Figure 13:
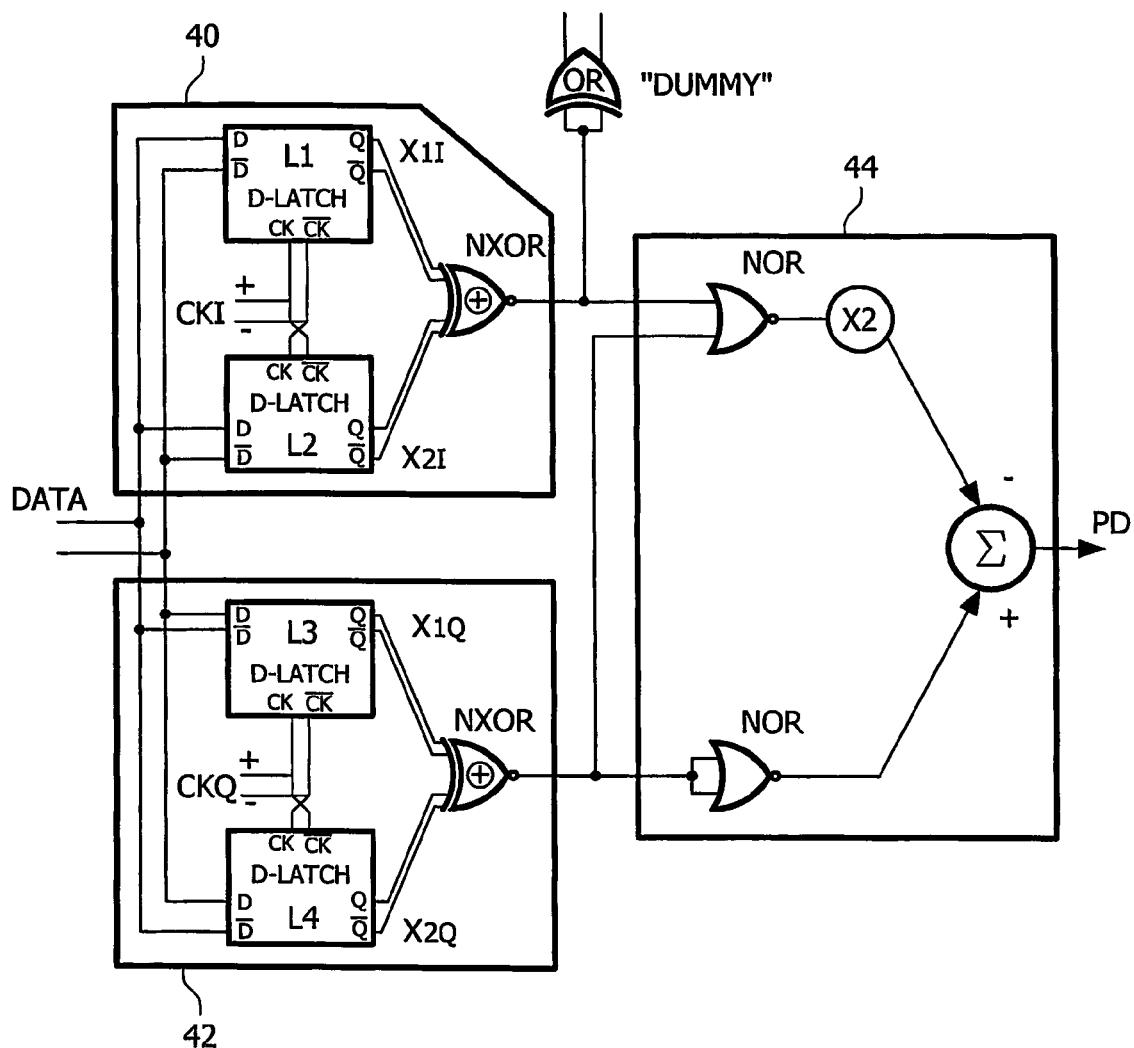
FIG. 13 shows a second embodiment of the present invention.

If the clock CKQ is early, then a current output PD with a positive average is generated. This is shown in FIG. 12. Again, when no data transitions occur, the output is 0. FIG. 13 shows a second embodiment of the phase detector according to the present inventions. The reference signal generators 40 and 42 shown in FIG. 13 are not the same as the ones shown in FIG. 9. The exclusive OR-gates XOR are replaced by exclusive NOR-gates NXOR Furthermore the AND-gate in the output signal generator of the phase detector is replaced by a NOR-gate. A NOR-gate is connected to the output of the reference signal generator 42 in FIG. 13. Both inputs of the NOR-gate connected to the output of the signal generator 42 have the same input. Therefore, the NOR-gate acts as an inverter.

The phase detector of FIG. 13 and the phase detector of FIG. 9 yield the same output PD. The output PD of FIG. 9 is defined by the following equation:

$$PD=ERRQ-2(ERRQ \times ERR) \quad (1)$$

$$PD=(X_{1Q} \oplus X_{2Q})-2(X_{1Q} \oplus X_{2Q}) \times (X_{1I} \oplus X_{2I}) \quad (2)$$

$$PD=PD=(X_{1Q} \oplus X_{2Q})-2*\overline{\overline{(X_{1I} \oplus X_{2I})}+(X_{1Q} \oplus X_{2I})} \quad (3)$$

The phase detector of FIG. 13 is just the logical implementation of equation (3). Therefore, FIGS. 10 to 12 also represent the signals generated by the phase detector of FIG. 13.

The two NXOR circuits shown in FIG. 13 have a differential input and a single ended output due to the specific implementation of the digital logic function NXOR. The phase detector output PD will be directly applied to a loop filter. The subtraction circuit of the output signal generator 44 may be based on a linear amplifier. A phase locked loop transfer will have a finite amplitude at 0 Hertz. Therefore, the phase locked loop will have a large static phase error, if implemented with the phase detector of FIG. 13. In order to circumvent the above mentioned draw back, a third embodiment of the present invention is proposed and shown in FIG. 14.

Figure 14:
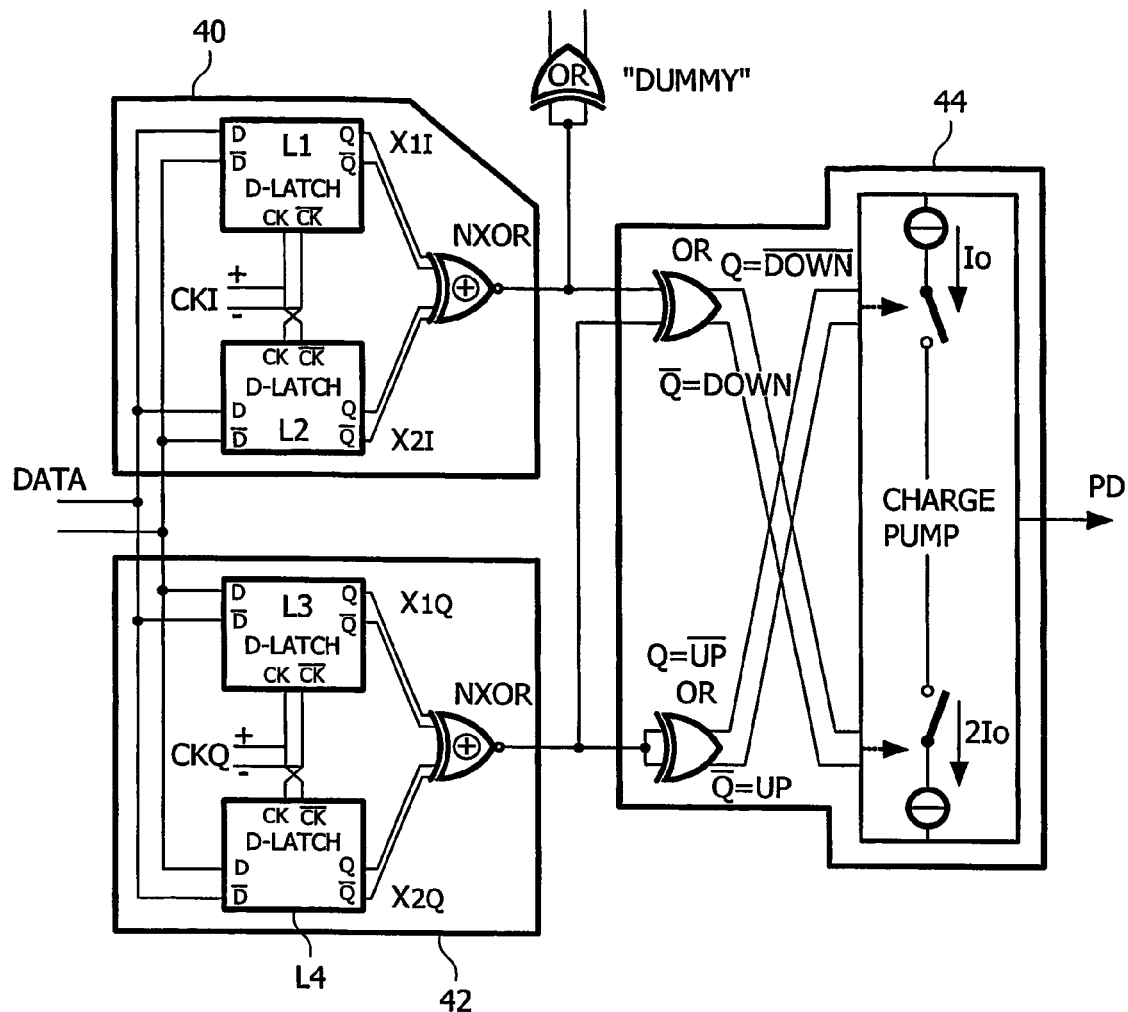
FIG. 14 shows a third embodiment of the present invention.

The phase detector of FIG. 14 comprises a charge pump. The multiplication and subtraction, which takes place in the multiplicator and subtractor shown in FIGS. 9 and 13, now takes place in the charge pump of the output signal generator of FIG. 14. The advantage of the approach is the integrator like loop transfer with the finite amplitude of 0 Hertz. Hence, the static phase error will be dramatically reduced. The OR-gates of the output signal generator 44 have single a ended input and a differential output. The differential output is needed by the differential type of charge pump. Two signals UP and DOWN are generated for driving the charge pump differentially. The differential output UP in FIG. 14 corresponds to signal ERRQ in FIG. 9 and the differential output DOWN corresponds to signal ERRI' in FIG. 9. The voltage differences transferred to the charge pump are converted into a corresponding current and the multiplication and subtraction of the current is carried out by the charge pump.

FIGS. 13 and 14 each comprise a "dummy"-OR-gate. The dummy-OR-gate is connected in both cases to the output of the respective second reference signal generator 40. The dummy-OR-gate is needed in order to delay the output of the second reference signal generator 40, such that the second and first reference signal generators 40 and 42 yield outputs having the same delay.

Figure 15:
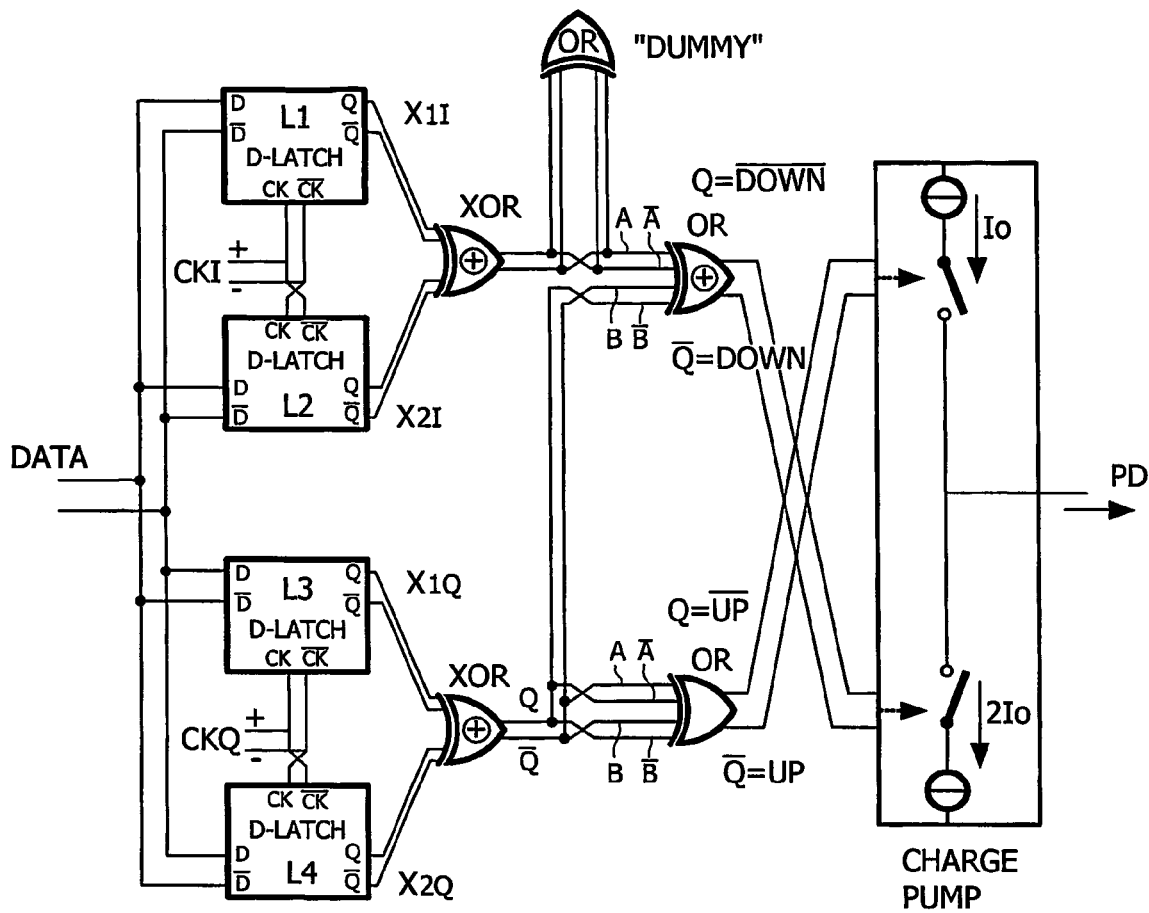
FIG. 15 shows a fourth embodiment of the present invention.

A pure differential approach for the phase detector is also possible and the embodiment of such a phase detector is shown in FIG. 15. This embodiment is based exclusively on differential XOR-gates and differential OR-gates. The outputs UP and DOWN are again a realisation of the logic equation (3). Similar to the phase detector of FIG. 14, the phase detector of FIG. 15 comprises a charge pump having two current sources. The current source controlled by the UP signal is two times smaller than the current source controlled by the down signal. This implements the multiplication by two from FIGS. 9 and 13.

Figure 16:
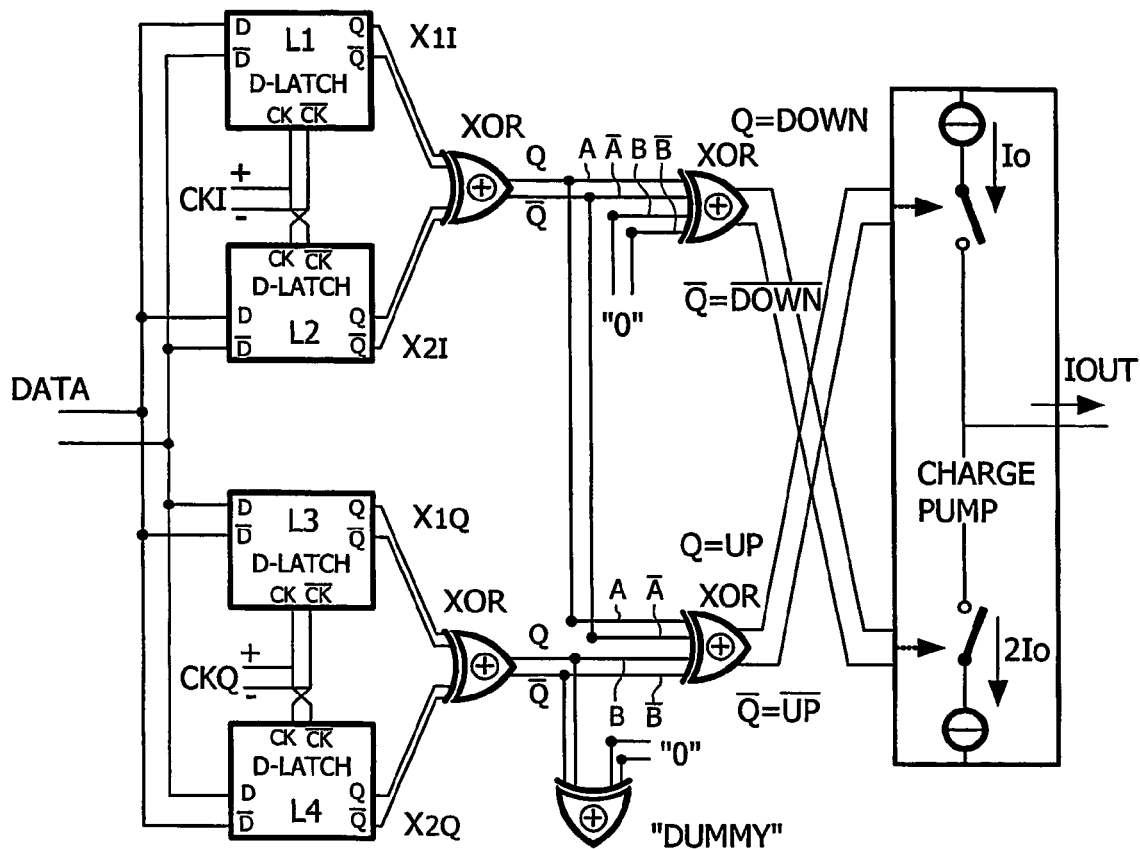
FIG. 16 shows a fifth embodiment of the present invention.

A fifth embodiment of the phase detector according to the present invention is shown in FIG. 16. The phase detector of FIG. 16 comprises exclusively XOR-gates and D-latches. In a differential implementation, the same building blocks simplify the layout of the circuit. Another advantage of using differential XORs consists in the particular implementation of the XOR (the same holds for the OR) without stacking transistors. When stacking transistors are used, source follower are needed. The consequence is the amplitude reduction and speed penalty of the logic gate. This is the case of any implementation with the AND-gates.

The particularity of the phase detector of FIG. 16 is the fact, that the current sources in the charge pump are identical and easy to match. Both current sources provide a current of I0. The XOR-gate for the down signal has one input connected to 0 logic and an extra dummy XOR is added at the input of the down XOR. The behaviour of the phase detector can be described by the following logic equation:

$$PD=\text{Up-Down} \quad (4)$$

$$\text{Down}=(X_{1I} \oplus X_{2I})=ERRI \quad (5)$$

$$\text{Up}=(X_{1Q} \oplus X_{2Q}) \oplus (X_{1I} \oplus X_{2I})=ERRQ \oplus ERRI \quad (6)$$

The equation (4) yields the same output signal as the equation (1) implemented by the phase detectors of FIGS. 9, 13, 14 and 15.

Figure 17:
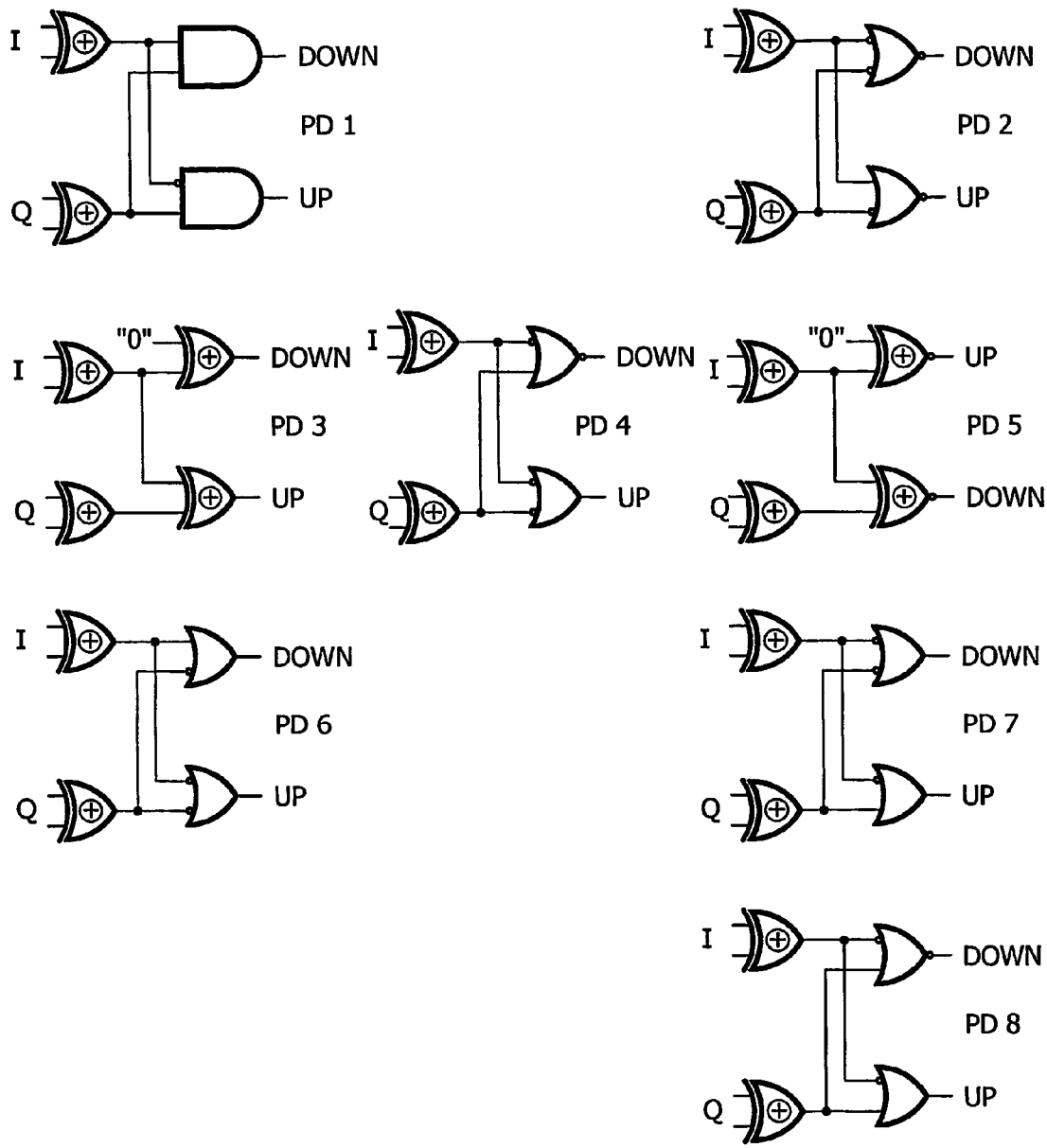
FIG. 17 shows eight different logical implementations of the phase detector of FIG. 16.

FIG. 17 shows eight different logical implementations PD1 to PD8 of the phase detector of FIG. 16. The logical implementation PD3 corresponds to the logical implementation chosen for the phase detector of FIG. 16. PD3 does not have differential inputs and outputs, but it is apparent to a person skilled in the art, that exclusive OR-gates with differential inputs and outputs may be used. The exclusive OR-gates providing an output DOWN and UP in PD3 correspond to the exclusive OR-gates in FIG. 16 providing the outputs DOWN and UP. The exclusive OR-gate in PD3 labeled with I and Q correspond to the exclusive OR-gates having the inputs $X_{1L}$ and $X_{2L}$ as well as the exclusive OR-gate having the inputs $X_{1Q}$ and $X_{2Q}$ respectively. The "dummy"-XOR-gate used in FIG. 16 is not shown in PD3, since it is merely an advantageous but not a necessary component. The other logic implementations shown in FIG. 17 or connected to the charge pump of FIG. 16 and the D-latches L1, L2, L3 and L4.

Figures 18A, 18B:
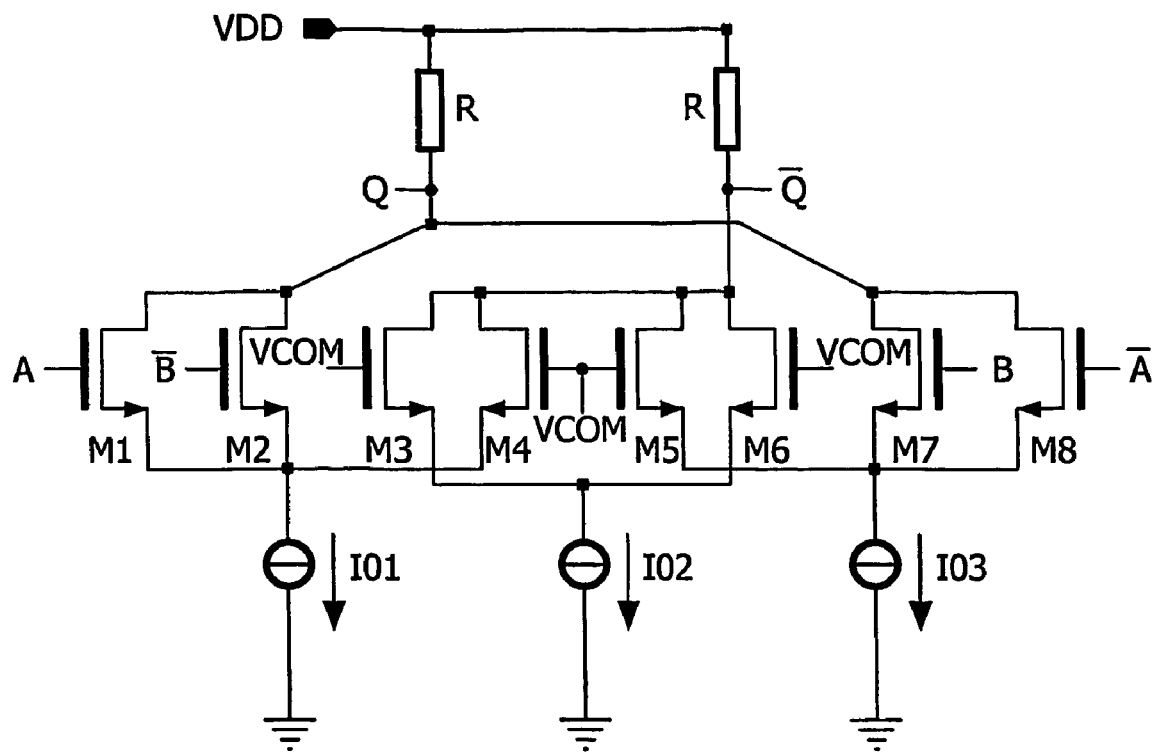
FIG. 18A shows an XOR-gate, which may be used in the embodiments of the present invention.
FIG. 18B shows a logic table of the differential XOR-gate of FIG. 18A.

FIG. 18A shows an XOR-gate, which may be used in one of the previously discussed embodiments of the present invention. The logic gate of FIG. 18 has a first differential input A,$\overline{A}$ and a second differential input B,$\overline{B}$. The differential output of the gate is represented by Q, $\overline{Q}$. The differential XOR-gate of FIG. 18 further comprises eight transistors M1, M2, M3, ..., M8. Furthermore, three current sources I01, I02 and I03 are provided in the XOR-gate. Current source I01 connects the transistors M1, M2 and M4 with ground. Current source I02 connects transistors M3 and M5 with the ground and current source I03 connects transistors M5, M7 and M8 with ground. Each of the inputs A, $\overline{A}$, B and $\overline{B}$ are connected to the gate of one of the transistors M1, M2, M7 and M8. The current sources I01, I02 and I03 each provide the same constant current I0. The current sources added to the tails of the transistors M1 to M8 allow the control of a swinging temperature and the control of process variations by ensuring a constant voltage Io*R. R represents the resistors connected to the differential output Q, $\overline{Q}$ as well as the resistance of these resistors. A constant current source increases the supply rejection with respect to ground and a constant supply current in this positive supply. In a PLL-DCR configuration this is an important advantage since other building blocks like charge pumps and VCOs can be built with less constraints for common mode signals.

FIG. 18B shows a logic table of the differential XOR-gate of FIG. 18A and the analog values at the output of the XOR-gate. The differential swing between logic states is I0*R. I0*R represents the voltage difference at the differential output Q, $\overline{Q}$. The common mode voltage VCOM shown in FIG. 18A is chosen a bit different from the common mode of the differential inputs. The transistors M3 and M6 are connected to the same current source I02 and therefore, in the negative output, the constant current is always present.

Figure 19:
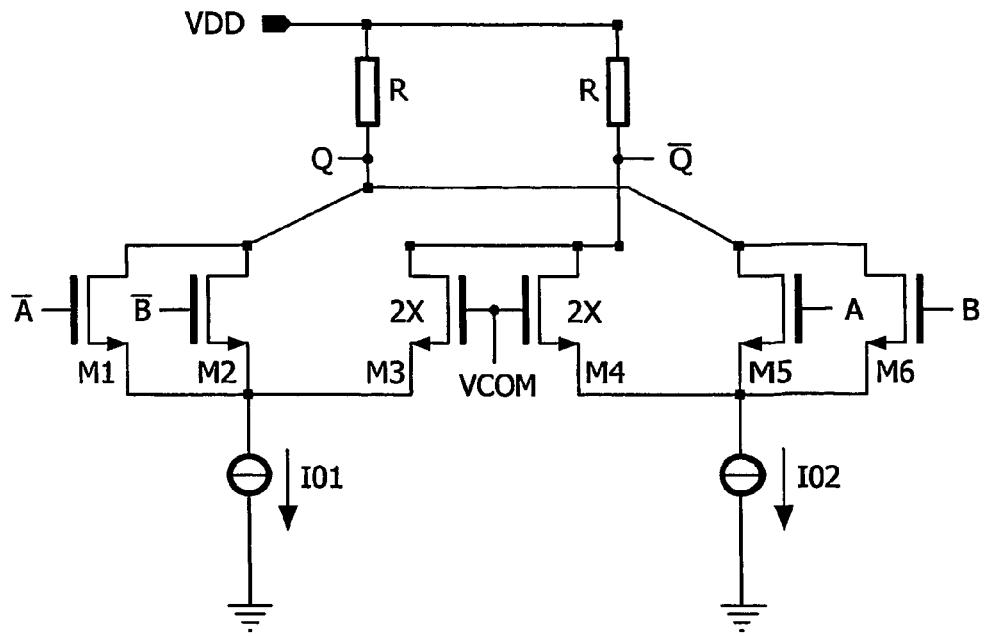
FIG. 19 shows a NXOR-gate, which may be used in the embodiments of the present inventions.

FIG. 19 shows a NXOR-gate having two differential inputs A, $\overline{A}'$ and B, B and a single ended output Q. The differential inputs of the NXOR-gate of FIG. 19 are each connected to a gate of one of the transistors M1, M2, M5 and M6 which are shown in FIG. 19. A common mode voltage VCOM is connected to the gates of transistors M3 and M4 shown in FIG. 19. A first current source I01 is connected to transistors M1, M2 and M3. A second current source I02 is connected to transistors M4, M5 and M6. Current sources I01 and I02 both provide the same current I0. The transistors M3 and M4 are needed in order to keep the current source I01 out of saturation, when both inputs A' and B' are low.

Figure 20A:
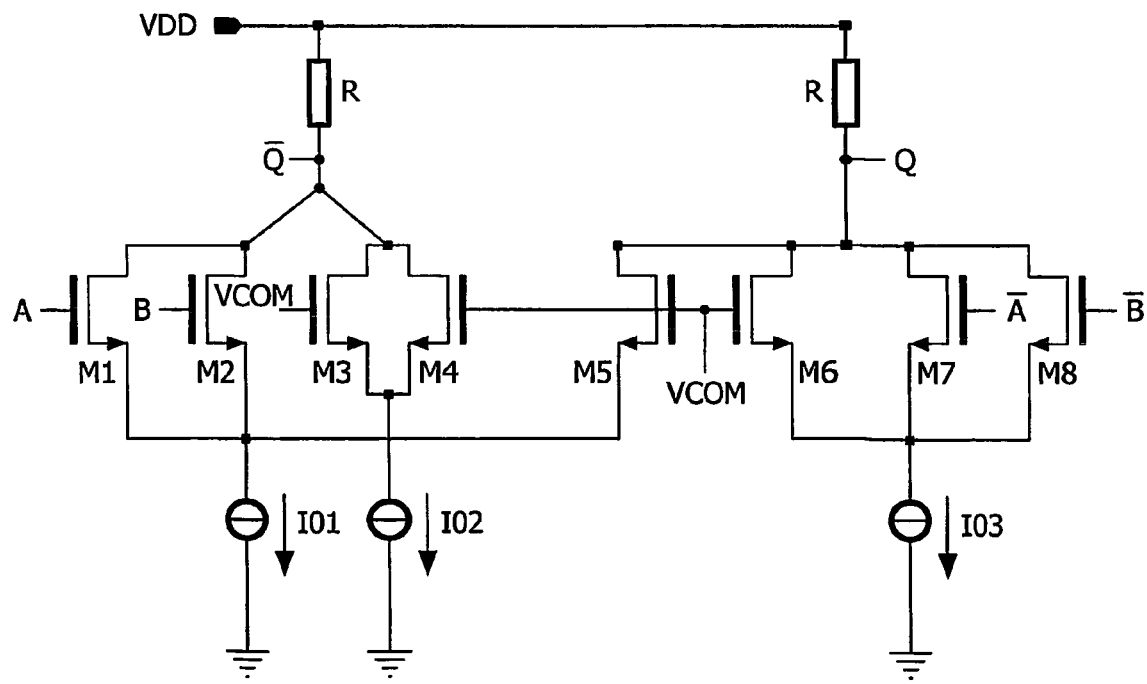
FIG. 20 shows a differential OR-gate, which may be used in the embodiments of the present invention.
Figures 20B, 21:
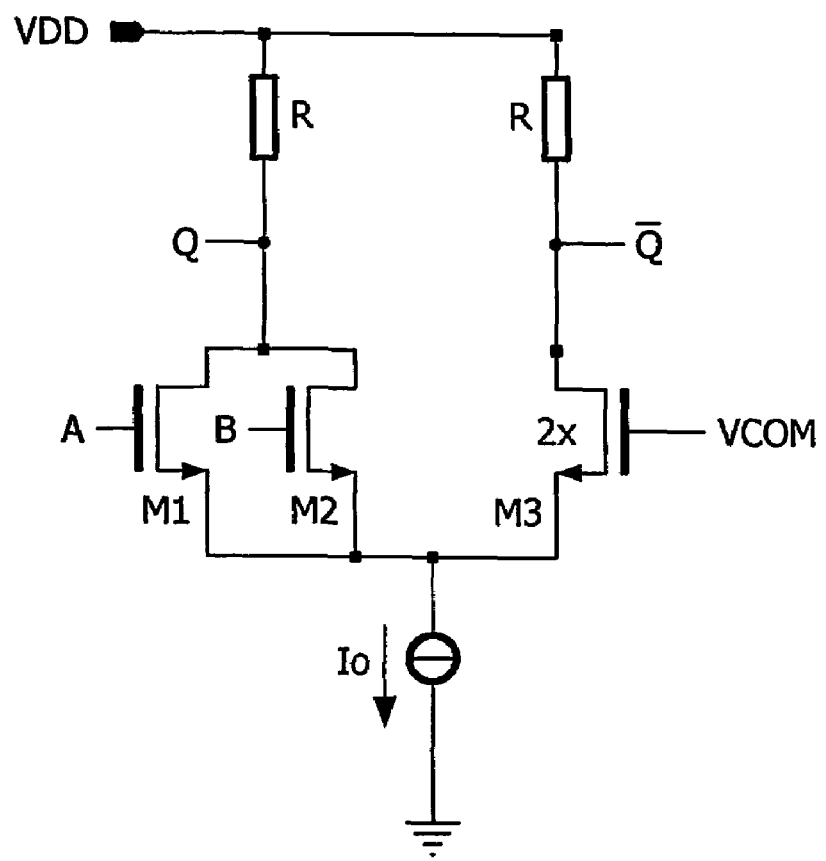
FIG. 21 shows a further OR-gate which may be used in the embodiments of the present invention.

FIG. 20 shows a differential OR-gate which may be used in one of the phase detectors previously discussed. The differential OR-gate of FIG. 20 comprises two differential inputs A, $\overline{A}$ and B, $\overline{B}$ as well as an differential output Q, $\overline{Q}$. Eight transistors M1 to M8 are provided in the differential OR-gate. Input A is connected to the gate of transistor M1, input B is connected to the gate of transistor M2. Transistors M1 and M2 are both connected to the current source I01. The gates of transistors M3 and M4 are each fed by common mode voltage VCOM. The sources and drains of these transistors are connected to each other. Transistors M1, M2, M3 and M4 are each connected to the output $\overline{Q}$. The differential inputs $\overline{A}$ and $\overline{B}$ are connected to the gates of the transistors M7 and M8. Transistors M6, M7 and M8 are each connected to the current source I03. Transistor M6 has a common mode voltage VCOM at its gate. Transistors M5, M6, M7 and M8 are each connected to the output Q. FIG. 20B shows a logical table of the differential OR-gate of FIG. 20A.

FIG. 21 shows an OR-gate which may also be used in each one of the phase detectors previously discussed. The OR-gate of FIG. 21 has two single ended inputs A and B and a differential output Q, $\overline{Q}$. Transistors M1, M2 and M3 are provided in the OR-gate of FIG. 21. The gates of transistors M1 and M2 form the inputs A and B respectively. The tails of the transistors M1, M2 and M3 are each connected to a common current source I0. A common mode voltage VCOM forms the gate of transistor M3.

Figure 22:
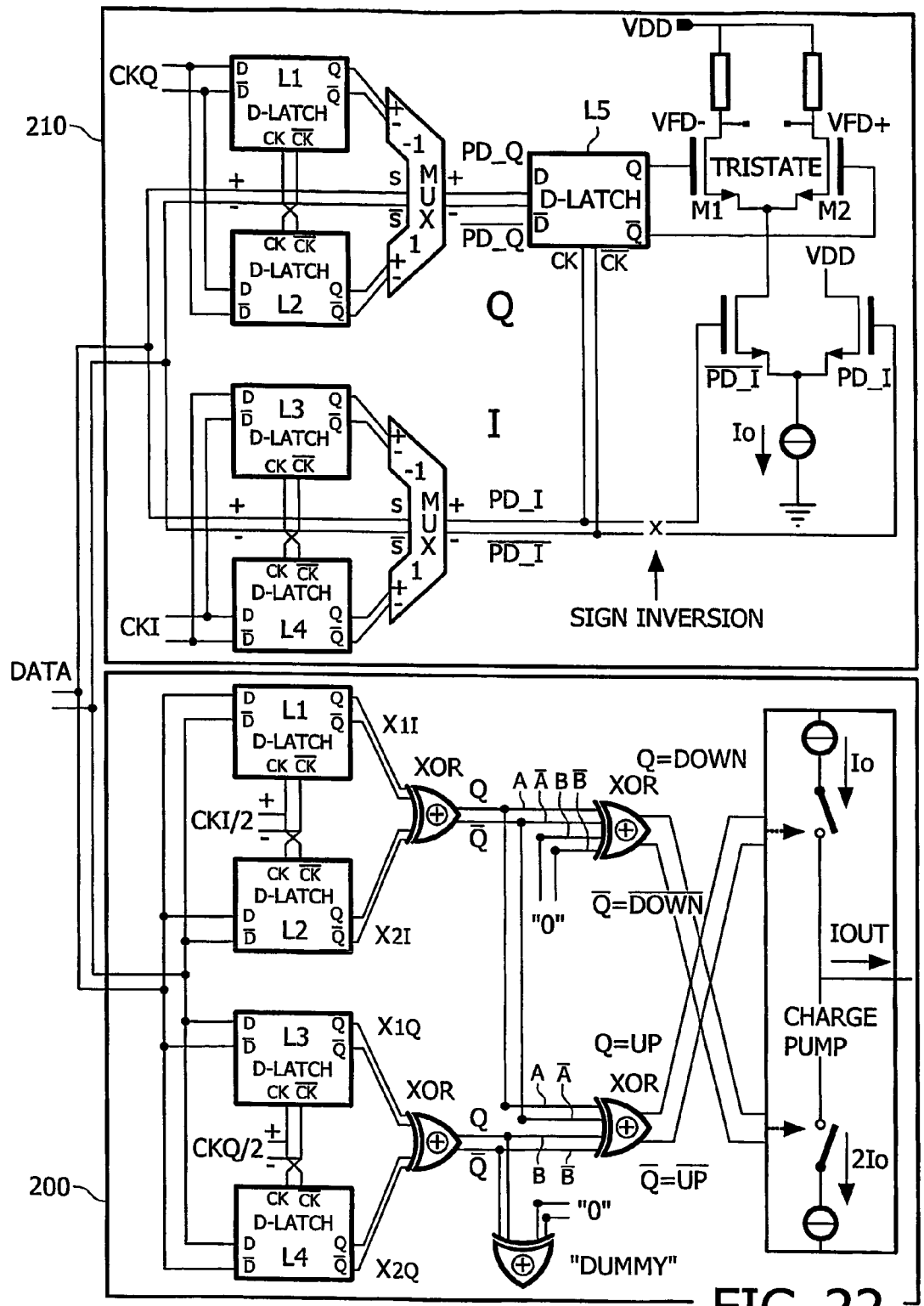
FIG. 22 shows a phase frequency detector comprising a phase detector according to the present invention.

FIG. 22 shows a phase frequency detector comprising a phase detector 200 and a frequency detector 210. The phase detector 200 in FIG. 21 corresponds to the phase detector shown in FIG. 16. The reference clocks CKL and CKQ shown in FIG. 16 correspond to clock CKL/2 and CKQ/2 shown in FIG. 22 respectively. The frequency detector 210 has two reference clocks CKQ and CKL. Clocks CKQ and CKL of the frequency detector 210 are quadrature clocks, i.e. they have the same frequency and are phase shifted by T/4, wherein T is the period of the clocks. The frequency f=1/T of the reference clock CKQ and CKL corresponds to the frequency of the data clock. The reference clock CKL/2 and CKQ/2 are also two quadrature clocks having half the frequency of the data clock. The frequency detector 210 is a full rate frequency detector with tri-state output. The phase detector is a half rate phase detector detector. A frequency divider can generate two quadrature clocks CKI/2 and CKQ/2 derived form one of the two quadrature clocks CKQ and CKL at full rate. The frequency detector 210 has two D-latches L1 and L2, the differential output of which are connected to a MUX. This combination of D-latches and MUX operates as a latch clocked on both UP and DOWN transitions of the data signal. Therefore, the data transitions sample two quadrature clock signals CKI and CKQ at full speed. The output of the MUX will be updated only on the data transitions keeping the same error at the output between the transitions. Furthermore D-latches L3, L4 and another MUX form a similar combination of D-latches and MUX. The outputs of the MUX is shown in FIG. 22 have the reference signs PD_Q and PD_I. The PD_Q outputs correspond to the outputs of the phase detector and the PD_I outputs are in quadrature with PD_Q. The phase difference between DATA and CKQ (respectively CKI) is transformed in a positive or negative quantized signal. When the signal is positive the clock will increase its phase and for negative signals the clock will decrease its phase.

The invention claimed is:

1. Phase Detector for detecting a phase difference between a data clock (DATA-CLK) and a reference clock (REF-CLK) using a data signal (DATA), wherein a transition of the data signal (DATA) is synchronous with a transition of the data clock (DATA-CLK) and the data clock (DATA-CLK) and the reference clock (REF-CLK) have the same frequency, comprising:

a first signal generator (42) for generating a first binary signal (ERRQ), a pulse width of which is equal to a first time difference ($\Delta T1$) between a transition of the data signal (DATA) and a transition of a first reference clock signal (CKQ) adjacent to the transition of the data signal (DATA), wherein the first signal generator comprises an input for receiving the first reference clock signal (CKQ) and an input for receiving the data signal (DATA), wherein the first reference clock (CKQ) has half the frequency of the reference clock (REF-CLK) and is synchronous with the reference clock, a second signal generator (40) for generating a second binary signal (ERRI), a pulse width of which is equal to a second time difference ($\Delta T2$) between a transition of the data signal (DATA) and a transition of the second reference clock signal (CKI) adjacent to the transition of the data signal (DATA), wherein the second signal generator (40) comprises an input for receiving the second reference clock (CKI) and an input for receiving the data signal (DATA), output signal generator (44) for generating an output signal representative of the phase difference between the data clock (DATA-CLK) and the reference clock (REF-CLK), wherein the output signal is equal to ERRQ−2*(ERRQ AND ERRI) and AND represents a logical AND-operation, or the output is equal to (ERRQ XOR ERRI)−ERRI, wherein XOR represents a logical XOR-operation.

2. Phase detector for detecting a phase difference according to claim 1, wherein the first signal generator comprises two D-latches that are both adapted to receive the data signal (DATA), a first one of the two D-latches of the first signal generator is adapted to receive the first reference clock signal and a second one of the two D-latches of the first signal generator is adapted to receive an inverted first reference clock.

3. Phase detector for detecting a phase difference according to claim 2, wherein the second signal generator comprises two D-latches that are both adapted to receive the data signal (DATA), a first one on the two D-latches of the second signal generator is adapted to receive the second reference clock and a second one of the two D-latches of the second signal generator is adapted to receive an inverted second reference clock.

4. Phase detector according to claim 3, wherein signals output by the two D-latches of the first or second signal generator are either output to a XOR-gate or an XNOR-gate.

5. Phase detector for detecting a phase difference according to claim 1, wherein the output signal generator (44) comprises an AND-gate having two inputs and an output, the inputs of the AND-gate receive the first (ERRQ) and the second binary signal (ERRI), the output signal generator (44) comprises a multiplicator (*2) for multiplying the output of the AND-gate by 2, the output signal generator (44) comprises a subtractor (SUM) for subtracting the output of the multiplicator (*2) from the first binary signal (ERRQ), said subtractor having an output (PD) representing the output of the phase detector.

6. Phase detector according to claim 1, wherein the output signal generator comprises a first OR-gate (OR), wherein both inputs of the first OR-gate (OR) are connected to the first binary signal (ERRQ), the output signal generator comprises a second OR-gate, wherein a first input of the second OR-gate is connected to the first binary signal (ERRQ) an a second input of the second OR-gate is connected to the second binary signal (ERRI), and the output signal generator comprises a charge pump connected to an output of the first and second OR-gate (OR), the charge pump is adapted to multiply the output of the second OR-gate by 2 and subtract the result from the output of the first OR-gate.

7. Phase detector according to claim 1, wherein the output signal generator comprises a first XOR-gate, said first XOR-gate having an input receiving the first binary signal (ERRQ) and an input receiving the second binary signal (ERRI), the output signal generator comprises a second XOR-gate, said second XOR-gate having an input receiving the second binary signal (ERRI) and an input receiving a logical 0, the output signal generator (ERRQ) comprises charge pump, said charge pump being adapted to subtract an output of the second XOR-gate from the output of the first XOR-gate.

8. Method for detecting a phase difference between a data clock (DATA-CLK) and a reference clock (REF-CLK) using a data signal (DATA), wherein a transition of the data signal (DATA) is synchronous with a transition of the data clock (DATA-CLK), comprising the steps of:

receiving a first reference clock signal (CKQ) and a second reference clock (CKI) signal both having the same frequency (f) half as large as the frequency of the reference clock (REF-CLK), and a phase difference between the first reference clock signal (CKQ) and the second reference clock signal (CKI) is equal to 1/(4f), generating a first binary signal (ERRQ), a pulse width of which is equal to a first time difference ($\Delta T1$) between a transition of the data signal (DATA) and a transition of a first reference clock signal (CKQ) adjacent to the transition of the data signal (DATA), generating a second binary signal (ERRI), a pulse width of which is equal to a second time difference ($\Delta T2$) between a transition of the data signal (DATA) and a transition of the second reference clock signal (CKI) adjacent to the transition of the data signal (DATA), generating an output signal representative of the phase difference between the data clock (DATA-CLK) and the reference clock (REF-CLK), wherein the output signal is equal to ERRQ−2*(ERRQ AND ERRI) and AND represents a logical AND-operation.

* * * * *